HOUSING STRUCTURE AND METHOD OF MANUFACTURE FOR SEMI-CONDUCTOR DEVICE

Filed July 26, 1966

INVENTORS
JAMES HAUCK
DONALD GEORGE
BY
OSTROLENK, FABER, GERB & SOFFEN
ATTORNEYS

United States Patent Office 3,424,852

Patented Jan. 28, 1969

3,424,852

HOUSING STRUCTURE AND METHOD OF MANUFACTURE FOR SEMI-CONDUCTOR DEVICE

James Hauck, Torrance, and Donald George, Inglewood, Calif., assignors to International Rectifier Corporation, El Segundo, Calif., a corporation of California Filed July 26, 1966, Ser. No. 567,951

U.S. Cl. 174—17.05 6 Claims

Int. Cl. H05k 5/06

ABSTRACT OF THE DISCLOSURE

A solder ring for hermetically sealing a semiconductor device housing is slid over a lead of a semiconductor device, and is held between the semiconductor device within the housing and a base plate of the housing. The application of heat causes the solder ring to solder between the interior of the base plate and the periphery of the lead to form a hermetic seal between the two.

This invention relates to semiconductor devices, and more specifically relates to a novel housing structure and method for the assembly thereof for providing an improved hermetic seal for a semiconductor structure.

Semiconductor devices such as diodes and transistors are well known to the art where one or more junctions are formed in a semiconductor wafer and electrodes extend from various diverse conductivity regions in the wafer. It is further well known that such wafers must be protected from the external environment, and this is commonly achieved by encapsulation of the wafer in a suitable potting compound.

By way of example, a common arrangement for the encapsulation of wafers is shown in copending application Ser. No. 282,971, filed May 24, 1963, entitled, Double Headed Lead, in the name of Frank F. Pauli, and assigned to the assignee of the present invention, now U.S. Patent 3,242,393, which illustrates the use of double-headed leads soldered to the opposing surfaces of a wafer having a junction therein with a potting mass surrounding the double-headed leads and wafer. Such an arrangement provides a suitable hermetic seal for the wafer in many applications.

In other applications, however, the seal is not sufficient, and it is desired that this encapsulated assembly be placed in a standard metallic-type housing such as the so-called flangeless or top-hat type of arrangement. This then forms a second hermetically sealed housing around the potted mass to insure maximum wafer protection.

Arrangements of this type are shown in copending application Ser. No. 261,109, filed Feb. 26, 1963, in the name of Joe Wislocky, entitled Semiconductor Encapsulated and Sealed Within Housing, and assigned to the assignee of the instant invention, now U.S. Patent 3,274,457.

The present invention is directed to a novel housing structure and method of assembly therefor of the latter type wherein a previously hermetically sealed wafer captured in a potting mass is subsequently assembled within a second housing of the flangeless or top-hat type. However, if desired, the invention could be practiced in connection with a bare wafer which has not yet been potted with the single housing structure of the invention serving the complete hermetic sealing function.

In accordance with the invention, the wafer structure which is to be carried within the outer housing will have two or more leads extending therefrom. These leads pass through suitable openings in the outer housing arrangement, and the outer housing is provided with a base section and body section which slide over the device leads and toward one another where they are welded to one another by suitable welding equipment.

In accordance with the invention, however, the lead extending through the base is surrounded by a solder ring which will hermetically and electrically connect the device lead to the opening in the base which receives the device lead.

In assembling the device, the body housing portion is resistance-welded to the base portion without affecting the solder ring or the soldering and hermetic sealing of the device lead extending through the base. Thus, the device is loosely contained within the assembly, although the assembly housing has been welded to its base. Thereafter, the entire assemblage is placed within a suitable heating apparatus, and the interior of the housing is evacuated. The temperature is then raised sufficiently to melt the soldering ring and cause it to flow from the device lead to the adjacent portions of the base through which the device lead passes. This will then cause a hermetic seal about the area in the base through which the lead passes and will further form a good electrical connection between the lead and the base. Thereafter, the other lead of the device which passes through an insulated portion of the body portion of the housing is electrically and mechanically hermetically sealed to the body as by a crimping operation. This latter operation can be performed after the housing is filled with a suitable nitrogen atmosphere or any other suitable inert gaseous atmosphere.

Accordingly, the device will now be completely hermetically sealed within the outer housing in a simple and novel manner.

Accordingly, a primary object of this invention is to form a novel hermetically sealed housing for semiconductor devices.

Another object of this invention is to provide a novel method of assembly of a semiconductor housing which leads to a hermetically sealed enclosure for a semiconductor device.

These and other objects of this invention will become apparent from the following description when taken in connection with the drawings, in which.

Figure 1:
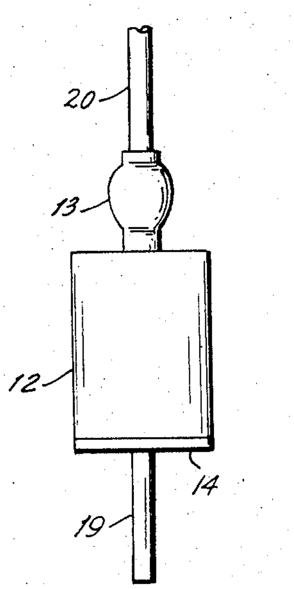
FIGURE 1 is a side plan view of the assembled device of the invention for the case of a flangeless housing.

Referring now to the figures, FIGURE 1 illustrates a typical flangeless-type of semiconductor device which has first and second leads 20 and 19 extending from a hermetically sealed housing 12. A crimp 13 is visible which marks the connection between lead 20 and a portion of housing 13.

Figure 3:
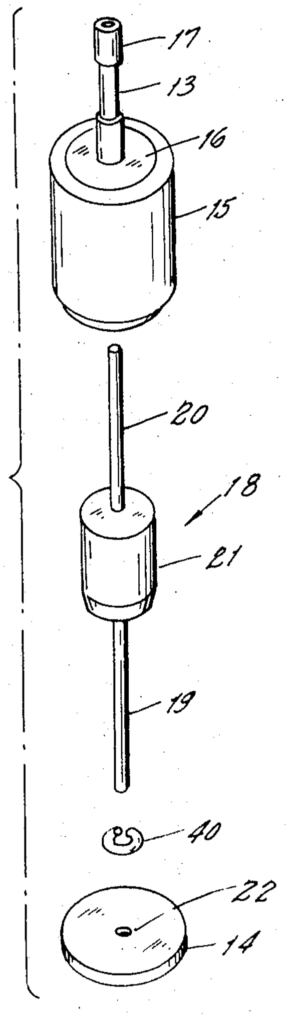
FIGURE 3 is an exploded perspective view of the components forming the assemblage of FIGURES 1 and 2.
Figure 2:
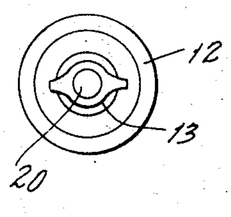
FIGURE 2 is a top view of FIGURE 1.

The components of FIGURES 1 and 2 are shown in exploded view in FIGURE 3 wherein the housing 12 of FIGURE 1 is comprised of a base portion 14 and a body portion 15. The body portion 15, which is a hollow metallic cylinder, has a glass bead 16 in the upper portion thereof which receives a conductive tube 17 at the center thereof which is insulated from the outer conductive cylinder portion by the glass bead 16.

A semiconductor device 18, which has extending leads 19 and 20 which are internally connected to the opposing surfaces of a semiconductor wafer is enclosed by a potting compound mass 21. Lead 19 is received by opening 22 in base 14, while lead 20 is received by tube 17 of housing body 15.

Figure 5:
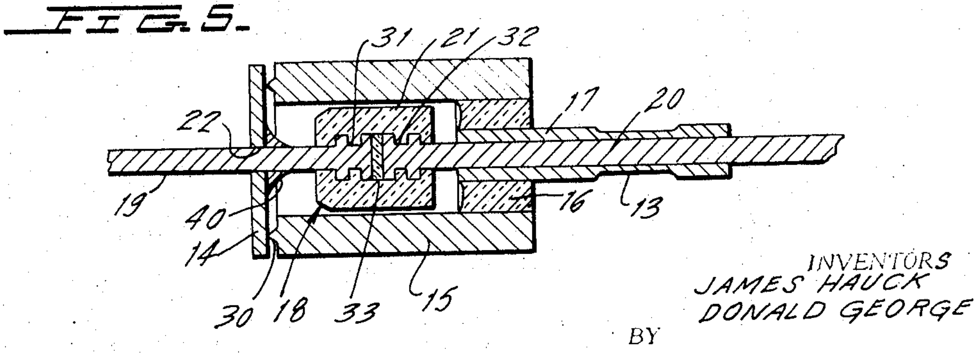
FIGURE 5 is a cross-sectional view through the assembled housing of FIGURE 1.

This assembled arrangement is illustrated in FIGURE 5. FIGURE 5 further illustrates the provision of a welding projection 30 at the base of conductive housing 15 and the use of double headed ends 31 and 32 for leads 19 and 20, respectively, which have been pre-assembled on the opposing surfaces of a semiconductor wafer 33 which could have a junction therein to define a diode.

Figure 4:
FIGURE 4 is a top plan view of the solder ring used in accordance with the invention.

In accordance with the invention, a solder ring 40, shown in FIGURE 4, is slid over lead 19 and snugly surrounds lead 19 immediately adjacent opening 22 in base 14. As will be seen more fully hereinafter, the use of the novel solder ring 40 permits the formation of an improved hermetic sealed housing for device 18 of FIGURE 3, and at the same time permits an improved method for the assembly of the device.

Satisfactory results have been obtained with ring-shaped solder pre-forms which are 60–40 tin-lead alloys having a flux core. The rings will have diameters related, of course, to the diameter of lead 19, and are arranged so that they can be closely fitted around lead 19.

In assembling the components of FIGURE 3 in accordance with the invention, all elements are suitably cleaned, and thereafter lead 20 is inserted into the housing body 15 and through tube 17 which closely fits about lead 20 while still permitting relative axial movement of lead 20 within tube 17. Thereafter, ring 40 is slid onto lead 19, and base plate 14 then receives lead 19 which passes through opening 22 in plate 14. Thus, the solder ring 40 is contained between encapsulated body portion 21 and plate 14. Thereafter, the plate 14 is welded to cylinder 15 as in a suitable resistance-welding apparatus where, however, the weld will not affect solder ring 14 as through the proper selection of welding currents and turns and the arrangement of heat sinks, and the like. This resistance weld is made around the welding projection 30 and forms a hermetic seal between plate 14 and the left-hand end of cylinder 15 in FIGURE 5.

Thereafter, the entire housing is placed in vacuum and heated to about 190° C. This will cause the solder ring 40 to melt, thereby to flow in the manner shown in FIGURE 5 to create a hermetic seal between lead 19 and the opening 22 in plate 14 as well as to form an extremely good electrical connection between lead 19 and plate 14. It has been found extremely important to carry this step out in vacuum in order to obtain the desired behavior of the solder ring 40.

Thereafter, and noting that lead 20 is not yet sealed within tube 17, the subassembly is placed in a nitrogen atmosphere or an atmosphere of some other suitable inert as, whereupon the inert gas can flow into the interior of the housing. Lead tube 17 is then hermetically crimped into engagement with lead 20, thereby to complete the hermetic sealing of the device 18 in the outer housing composed of the housing body portion 15 and base plate 14. Clearly, other means of electrically and mechanically connecting tube 17 and lead 20 could be used.

It will be apparent that this same operation could be applied to housings of the so-called top-hat construction wherein base plate 14 would have a larger diameter than the main housing portion, while the main housing portion would have an out-turned flange in registry with this enlarged diameter base plate.

Although this invention has been described with respect to its preferred embodiments, it should be understood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. In combination, a hermetically sealed housing and a semiconductor device within said hermetically sealed housing; said semiconductor device having a first and second extending lead; said housing comprising a base plate section having an opening therein and a hollow cylindrical body having a first and second end; said first end being open; said second end being closed and having a hollow tube extending outwardly therefrom and in communication with said hollow body; said first extending lead passing through said opening in said base plate section; said second extending lead passing through said hollow tube; said one end of said hollow cylindrical body hermetically secured to said baseplate section around a closed line on the surface of said base plate section; said hollow tube hermetically enclosing said second extending lead; and a solder ring surrounding said first lead and connected from said first lead to the adjacent surrounding area of said base plate section facing the interior of said hollow cylindrical body.

2. The combination of claim 1 wherein said hollow tube is connected to said hollow cylindrical body by insulation ring means; said hollow tube hermetically crimped to said second lead.

3. The combination of claim 1 wherein the outer diameter of said first end of said hollow cylindrical body is equal to the outer diameter of said base plate section.

4. The combination of claim 1 wherein the interior of said housing is filled with an inert gas.

5. The combination of claim 1 wherein said semiconductor device is encapsulated in a potting medium.

6. The method of manufacture of a semiconductor device comprising the steps of inserting a first lead of a semiconductor device through a hollow conductive tube of an open-ended housing body, sliding a solder ring over a second lead of said semiconductor device, sliding a base plate over said second lead of said semiconductor device, hermetically welding said open ended housing body to the periphery of said base plate, evacuating the interior of the volume formed by said housing body and base plate and heating said solder ring to cause it to flow from said first lead to said base plate, admitting an inert gas to the interior of said housing body through said hollow tube, and sealing said hollow tube around said first lead.

References Cited

UNITED STATES PATENTS

| | | | |
|---|---|---|---|
| 3,100,813 | 8/1963 | Rice et al. | 174—52 |
| 3,242,393 | 3/1966 | Pauli | 317—234 |
| 3,244,947 | 4/1966 | Slater | 317—234 |
| 3,337,781 | 8/1967 | Ferree | 317—234 |

LEWIS H. MYERS, *Primary Examiner.*

DAVID A. TONE, *Assistant Examiner.*

U.S. Cl. X.R.

29—588; 174—50.63